(12) United States Patent
Yoon

(10) Patent No.: US 7,042,137 B2
(45) Date of Patent: May 9, 2006

(54) ACTUATOR USING ORGANIC FILM MEMBRANE AND MANUFACTURING METHOD THEREOF

(75) Inventor: Yong-seop Yoon, Seoul (KR)

(73) Assignee: Samsung Electronics Co. Ltd., Kyungki-do (KR)

( * ) Notice: Subject to any disclaimer, the term of this patent is extended or adjusted under 35 U.S.C. 154(b) by 126 days.

(21) Appl. No.: 10/448,337

(22) Filed: May 30, 2003

(65) Prior Publication Data

US 2003/0235656 A1   Dec. 25, 2003

(30) Foreign Application Priority Data

Jun. 20, 2002   (KR) ...................... 10-2002-0034650

(51) Int. Cl.
*H01L 41/08* (2006.01)
(52) U.S. Cl. ...................... 310/324; 310/365
(58) Field of Classification Search ................ 310/309, 310/324, 365
See application file for complete search history.

(56) References Cited

U.S. PATENT DOCUMENTS

| | | | | |
|---|---|---|---|---|
| 3,752,941 A | * | 8/1973 | Massa et al. | 310/324 |
| 5,286,975 A | * | 2/1994 | Ogura et al. | 250/338.3 |
| 5,453,628 A | * | 9/1995 | Hartsell et al. | 257/76 |
| 5,789,845 A | * | 8/1998 | Wadaka et al. | 310/334 |

FOREIGN PATENT DOCUMENTS

| | | | |
|---|---|---|---|
| JP | 10-209794 | * | 8/1998 |
| JP | 2001-102902 | * | 4/2001 |
| KR | 2001-0045309 A | | 6/2001 |

* cited by examiner

Primary Examiner—Thomas M. Dougherty
(74) Attorney, Agent, or Firm—Sughrue Mion, PLLC

(57) ABSTRACT

An actuator using an organic film membrane is provided and includes a substrate having a cavity with a bottom portion at a predetermined depth in the upper center, an organic film membrane attached on the upper surface of the substrate to close the upper portion of the cavity, and a driving electrode arranged on the organic film membrane. The driving electrode is driven by a piezoelectricity force or an electrostatic force. The membrane of the actuator can be easily fabricated, and the size of the actuator can be reduced while improving a yield.

5 Claims, 8 Drawing Sheets

ACTUATOR USING ORGANIC FILM MEMBRANE AND MANUFACTURING METHOD THEREOF

BACKGROUND OF THE INVENTION

This application claims the priority of Korean Patent Application No. 2002-34650, filed on Jun. 20, 2002, in the Korean Intellectual Property Office, which is incorporated herein in its entirety by reference.

1. Field of the Invention

Apparatuses and methods consistent with the present invention relate to an actuator using an organic film membrane and a manufacturing method thereof and, more particularly, to an actuator utilizing an organic membrane used in an inkjet head and a pressure sensor micro pump and a manufacturing method thereof.

2. Description of the Related Art

As shown in FIGS. 1 and 2, a conventional actuator including a membrane 3 driven by an electrostatic force or a piezoelectricity force is fabricated by integrally forming the membrane 3 on which a driving electrode or a piezoelectric material 5 is formed and a frame 2 supporting the membrane 3 on a silicon substrate 1. When manufacturing such an actuator, a micromachining technology is applied to a silicon wafer.

In this case, a wet etching using a pattern mask is performed in the micromachining process of the silicon wafer. The membrane and the frame supporting the membrane using the wafer are formed by wet etching. During the wet etching, a cavity 4 is formed under the membrane 3 as shown in FIGS. 1 and 2. When forming the cavity 4, an isotropic etchant is used, so an opening width D of the cavity 4 on the lower surface of a substrate is excessively large compared with the width d of the membrane. In other words, the cavity 4 having a width D larger than the width d of the membrane 3 is formed on the lower surface of the substrate 1. Accordingly, the width W of the substrate must be increased considering the width of the frame 2 that is designed to have an appropriate strength. Thus, the size of the substrate must be increased.

In addition, in order to drive the membrane 3, a piezoelectric material is deposited on the membrane 3 or the membrane 3 is bonded to another wafer, and the membrane 3 is driven by an electrostatic force or an electromagnetic force.

SUMMARY OF THE INVENTION

The present invention provides an actuator having excellent reproducibility that can be operated using a small driving force and a manufacturing method thereof.

The present invention also provides an actuator that can be easily manufactured at a low cost and a manufacturing method thereof.

The present invention further provides an actuator having a reduced size and a manufacturing method thereof having a better yield.

According to an aspect of the present invention, there is provided an actuator comprising a substrate having a cavity with a bottom portion at a predetermined depth in an upper center; an organic film membrane attached on an upper surface of the substrate to close an upper portion of the cavity; a fixed electrode formed on the bottom portion of the cavity; and a driving electrode arranged on the organic film membrane while coupling with the fixed electrode.

According to another aspect of the present invention, there is provided an actuator comprising a substrate having a cavity with a bottom portion at a predetermined depth in an upper center; an organic film membrane attached on an upper surface of the substrate to close an upper portion of the cavity; a piezoelectric material layer arranged on the membrane; and upper and lower electrodes arranged on and under the piezoelectric material layer on the membrane, respectively.

Preferably, but not necessarily, conductors are symmetrically formed at both sides of the lower electrode and the upper electrode, and the lower electrode and the upper electrode extend while crossing each other.

According to still another aspect of the present invention, there is provided a manufacturing method of an actuator using an organic film membrane, comprising (A) forming a cavity having a bottom at a predetermined depth in a substrate; (B) forming a fixed electrode on the bottom of the cavity; (C) attaching a separate organic film membrane on an upper surface of the substrate; and (D) forming a driving electrode on an upper surface of the organic film membrane to correspond to the fixed electrode.

BRIEF DESCRIPTION OF THE DRAWINGS

The above aspects and advantages of the present invention will become more apparent by describing in detail illustrative, non-limiting embodiments thereof with reference to the attached drawings, in which.

DETAILED DESCRIPTION OF THE ILLUSTRATIVE, NON-LIMITING EMBODIMENTS OF THE INVENTION

The present invention will now be described more fully with reference to the accompanying drawings, in which illustrative, non-limiting embodiments of the invention are shown.

Figure 1:
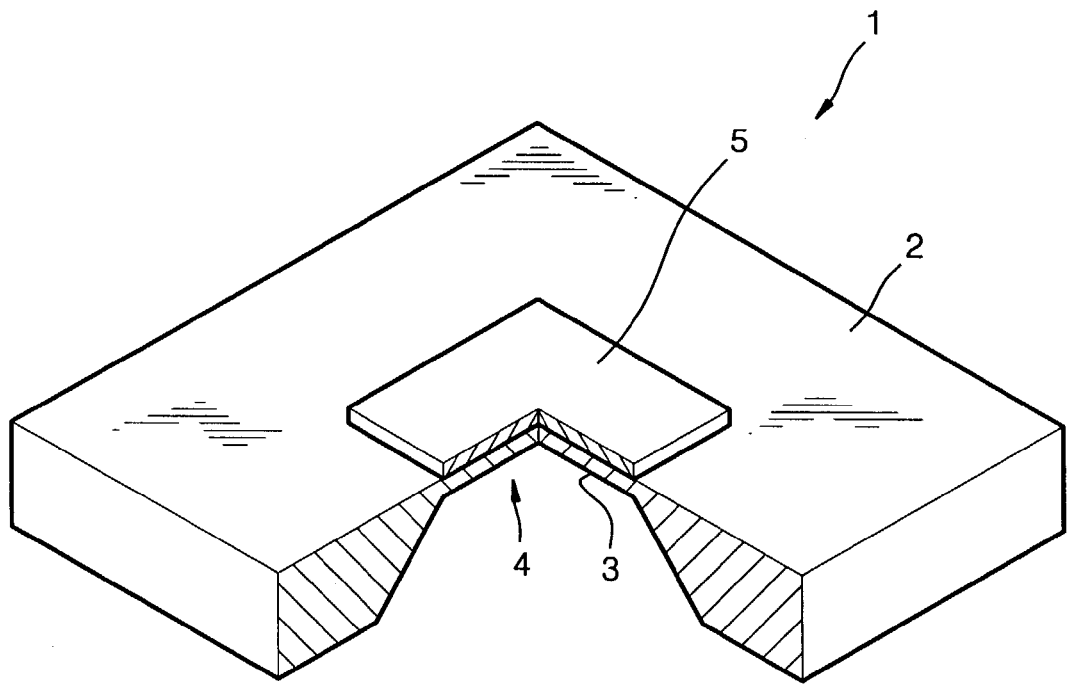
FIG. 1 is a perspective view illustrating the structure of a conventional actuator.
Figure 2:
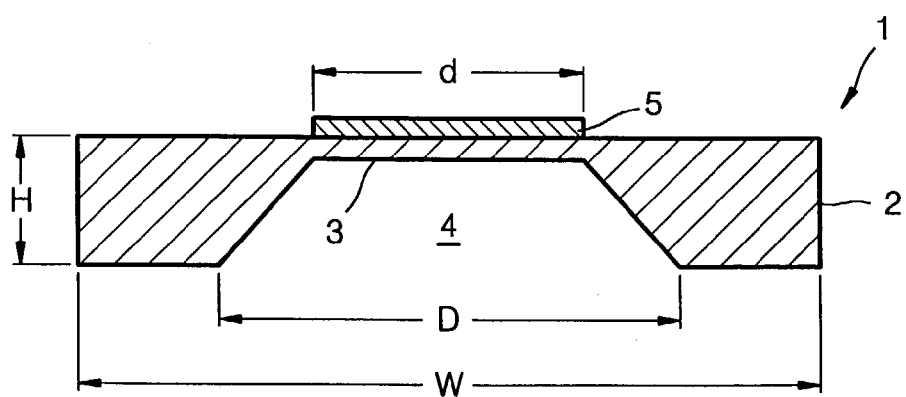
FIG. 2 is a sectional view illustrating the conventional actuator of FIG. 1.
Figure 3:
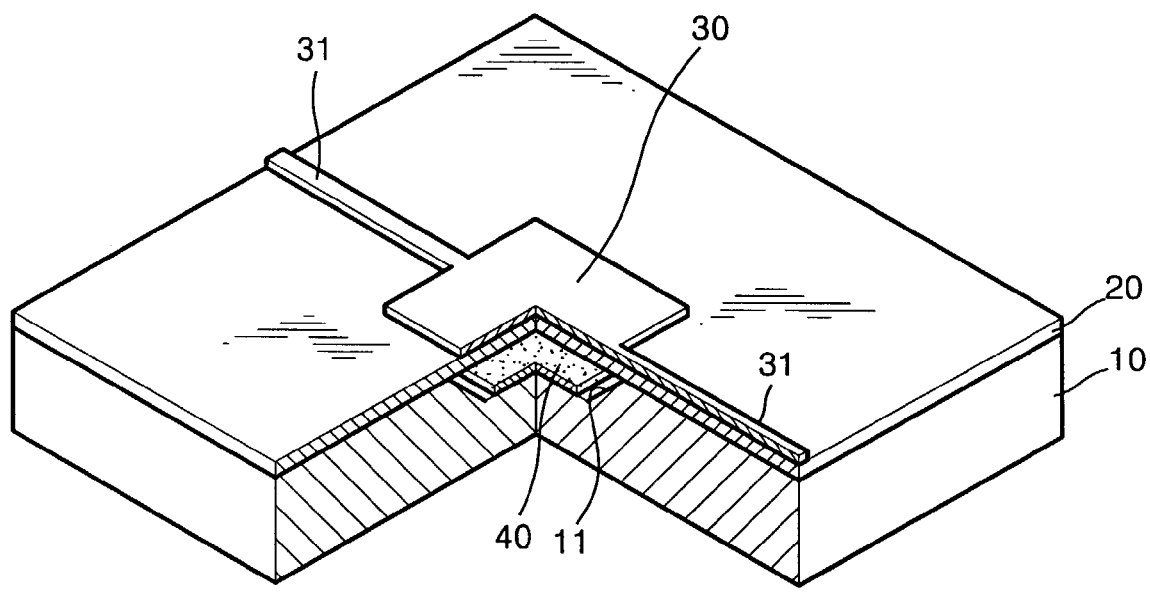
FIGS. 3 through 5 are a perspective view, a plane view, and a sectional view illustrating an actuator according to an exemplary embodiment of the present invention.
Figure 4:
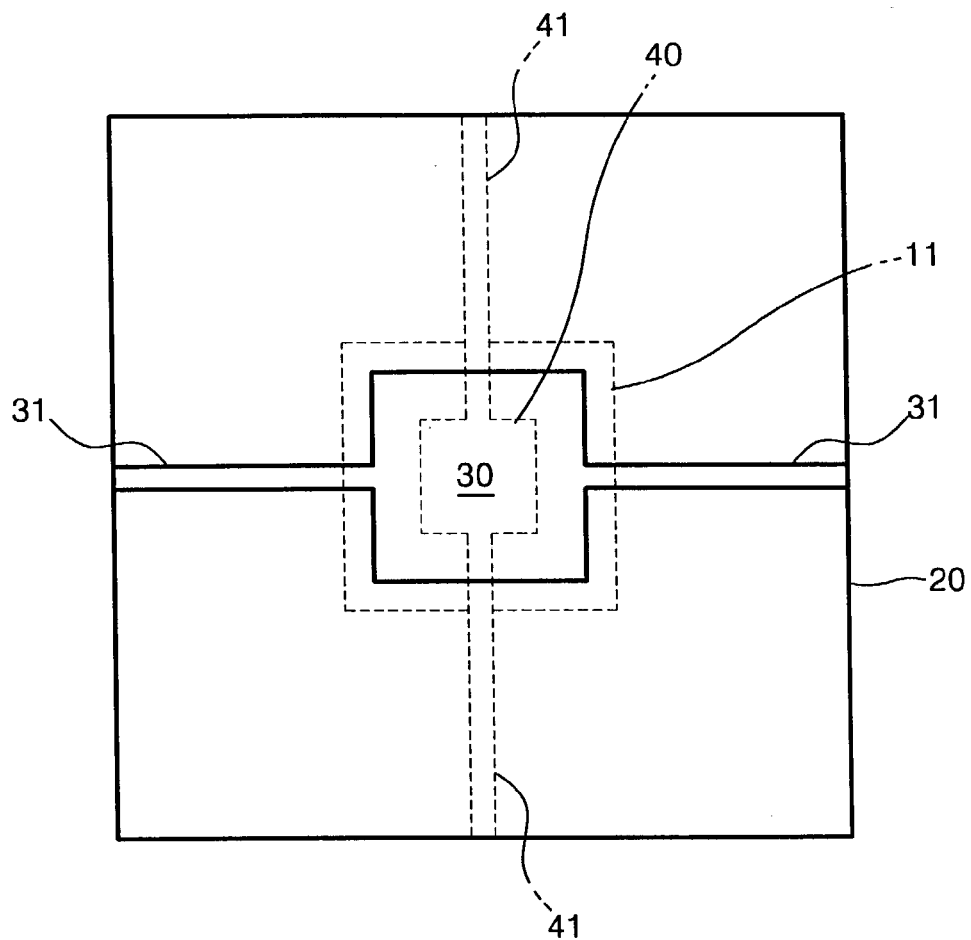
Figure 5:
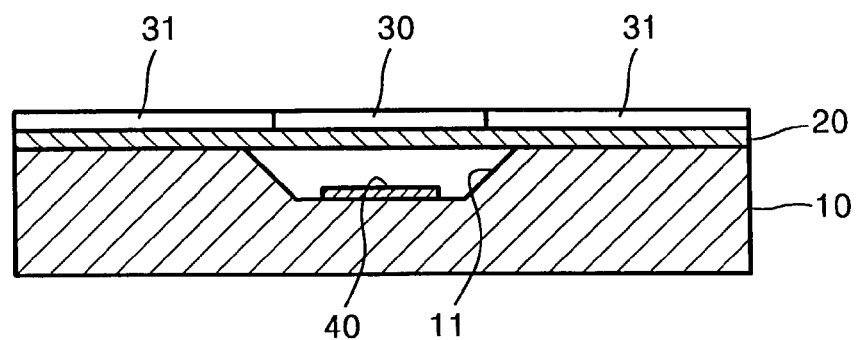

FIG. 3 is a perspective view, FIG. 4 is a plane view, and FIG. 5 is a sectional view illustrating an actuator according to an exemplary embodiment of the present invention.

The actuator shown in FIGS. 3 through 5 uses an organic film membrane that is manufactured according to an exemplary embodiment of the present invention.

As shown in FIGS. 3 and 4, an organic film membrane 20 is attached on the upper surface of a substrate 10 and a driving electrode 30 is formed on the upper center of the organic film membrane 20. Electric conductors 31 are symmetrically formed at both sides of the driving electrode 30.

The conductors 31 serve as restoring springs when the membrane 20 is deformed. Accordingly, preferably, but not necessarily, the conductors 31 are symmetrically formed in order to restore the membrane 20 to its initial shape. A cavity 11 having a predetermined depth in the substrate 10 is arranged below the driving electrode 30, and a fixed electrode 40 is formed on the bottom of the cavity 11 to correspond to the driving electrode 30. The fixed electrode 40 formed on the bottom of the cavity 11 may extend to the edges of the cavity 11.

Electric conductors 41 are connected to the fixed electrode 40. In this case, the electric conductors 41 can be symmetrically formed with respect to the fixed electrode 40 or formed at one side of the fixed electrode 40.

The membrane for the actuator consistent with the present invention is obtained by laminating an organic film on the upper surface of the substrate instead of using a bulk etching method.

The actuator consistent with the present invention does not require an etching process for forming a membrane, but utilizes a process for forming the cavity 11 having the bottom on which the fixed electrode 40 is formed. In this case, the depth of the cavity 11 is set to correspond to the minimum distance between the driving electrode 30 and the fixed electrode 40, for example, about 10 microns. Accordingly, the thickness of the substrate 10 can be reduced. In addition, in the actuator consistent with the present invention, the shape of the membrane is changed using an electrostatic force generated between the fixed electrode and the driving electrode, and does not use a piezoelectrode. In other words, when a voltage is applied between the driving electrode 30 and the fixed electrode 40, an electrostatic force is generated. The electrostatic force is transferred to the membrane 20 to change the shape of the membrane 20. When the voltage is not applied anymore, the membrane 20 is restored to its original shape. When the membrane 20 changes its shape, an electrostatic attraction force Fe is equivalent to the elastic restoring force of the electric conductors 31 connected to the membrane 20 and the driving electrode 30.

The electrostatic attraction force $F_e$ between the driving electrode 30 and the fixed electrode 40 is presented in Equation 1 below. In this case, $\in$ denotes a dielectric constant, $D$ denotes an initial distance between the electrodes 30 and 40, $X$ denotes a replacement distance of the driving electrode 30, $A$ denotes an effective area to which the electrostatic force between the electrodes 30 and 40 is performed, and $V$ denotes a voltage.

$$F_e = \frac{\varepsilon A V^2}{2(D-X)^2} \quad (1)$$

Figure 6A:
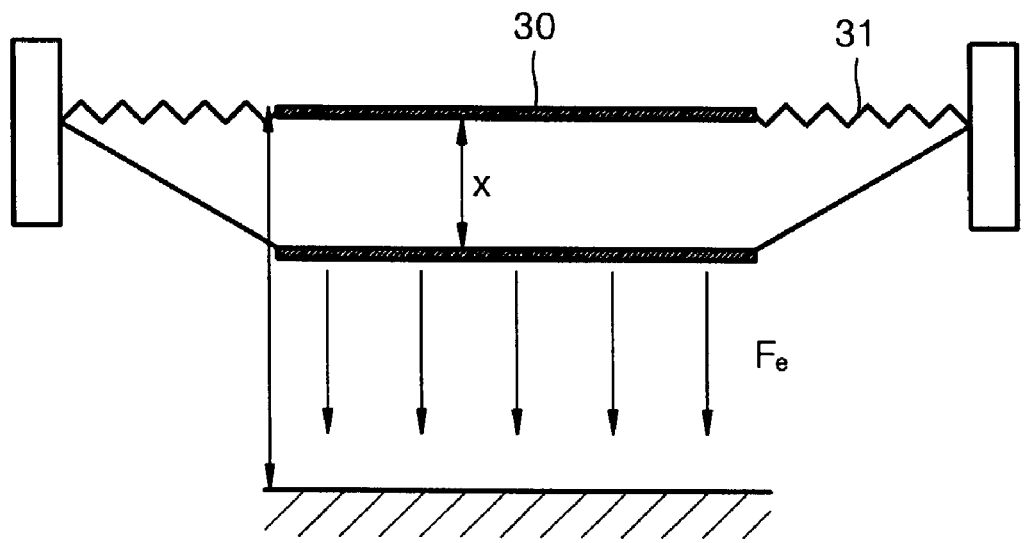
FIGS. 6A and 6B are analysis models for explaining transformations of a conductor and a membrane when driving the actuator, according to the embodiment of the present invention.
Figure 6B:
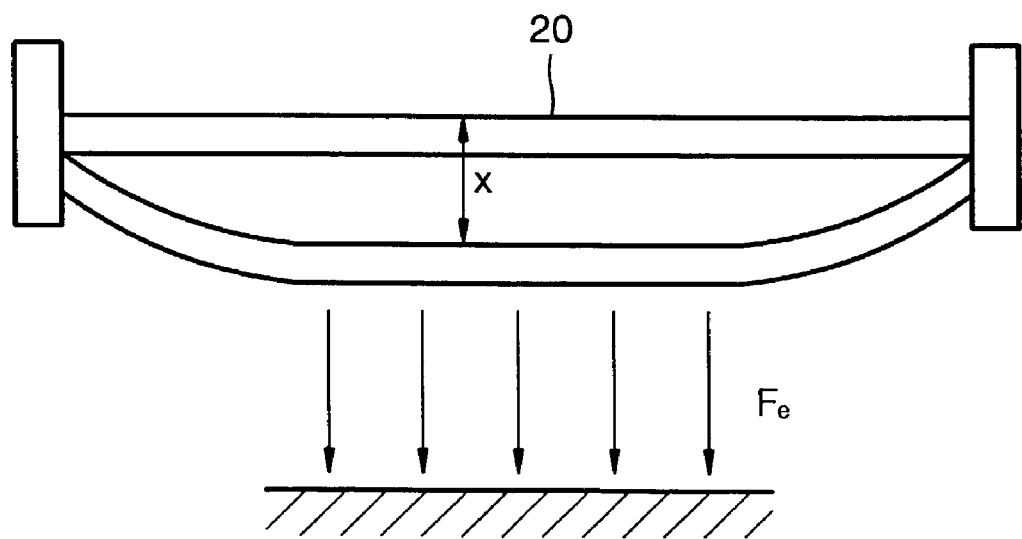

When the membrane 20 is deformed due to such electrostatic attraction force, the conductors 31 are bent at the same time. Accordingly, the transformations of the membrane 20 and the conductors 30 are coupled with one another when driving the actuator. FIGS. 6A and 6B are analysis models for explaining the transformations of the conductors 31 and the membrane 20, respectively.

The reaction force $F_c$ between the conductors 31 at both sides of the driving electrode 30 that bend when the membrane 20 changes its shape is given in Equation 2.

$$F_c = 2kx \quad (2)$$

In this case, $k$ denotes an elastic coefficient with respect to a bending direction in the case where the conductors are assumed as cantilevers, and $x$ denotes a transformation amount. However, when the membrane 20 changes its shape, a direct stress also occurs in the conductors 31 as well as bending, so $k$ should be an elastic coefficient considering bending and the direct stress of the conductors 31. However, when it is assumed that the transformation amount is small, the conductors 31 can be considered as simple cantilevers.

On the other hand, a reaction force $F_m$ of the membrane can be obtained as follows. When the edges of the membrane 20 are clamped to the substrate 10, a transformation amount $x$ and the reaction force $F_m$ of the membrane 20 are given as in Equation 3 and Equation 4 using a relationship between a distribution load and the maximum transformation amount of the membrane 20.

$$x = \frac{12(1-v^2)F_m a^4}{E'h^3 A}\alpha\beta \quad (3)$$

$$F_m = \frac{E'h^3 A}{12(1-v^2)a^4\alpha\beta}x \quad (4)$$

Here, $h$ denotes the thickness of the membrane 20, $E'$ denotes Young's modulus of the membrane 20, $A$ denotes the area of the driving electrode 30, $a$ and $b$ denote the horizontal and vertical lengths of the membrane 20, $\alpha$ denotes a variable according to the ratio of the vertical length to the horizontal length of the membrane 20, and $\beta$ denotes a correction factor.

Accordingly, Equation 5 can be obtained from the electrostatic force $F^e$, the reaction force $F_c$ between the conductors 31, and the reaction force $F_m$ of the membrane 20 using Equations 1, 2, and 3.

$$\frac{\varepsilon A V^2}{2(D-x)^2} = \left(k + \frac{E'h^3 A}{12(1-v^2)a^4\alpha\beta}\right)x \quad (5)$$

A manufacturing method of the actuator according to the embodiment of the present invention will now be described.

Figure 7A:
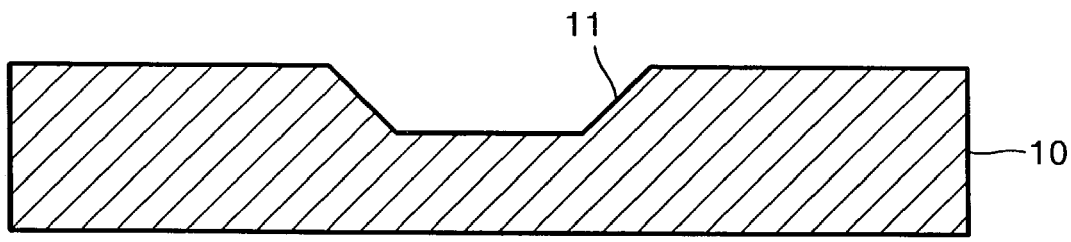
FIGS. 7A through 7E are views illustrating a manufacturing method of an actuator, according to an exemplary embodiment of the present invention.

Referring to FIG. 7A, a cavity 11 having a flat bottom is formed in the upper center of a substrate 10. In this case, the cavity 11 can be formed by a photolithography process including conventional etching. The depth of the cavity 11 is adjusted to be about 10 microns to move a membrane 20.

Figure 7B:
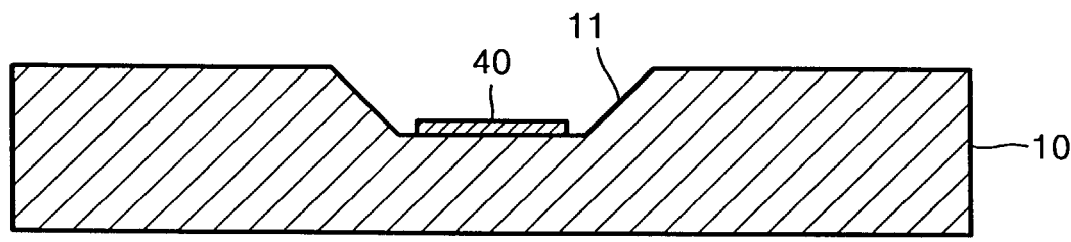

Referring to FIG. 7B, a fixed electrode 40 is formed on the bottom of the cavity 11. Here, a conductor material, for example, aluminum (Al), is deposited and the deposited Al is patterned.

Figure 7C:
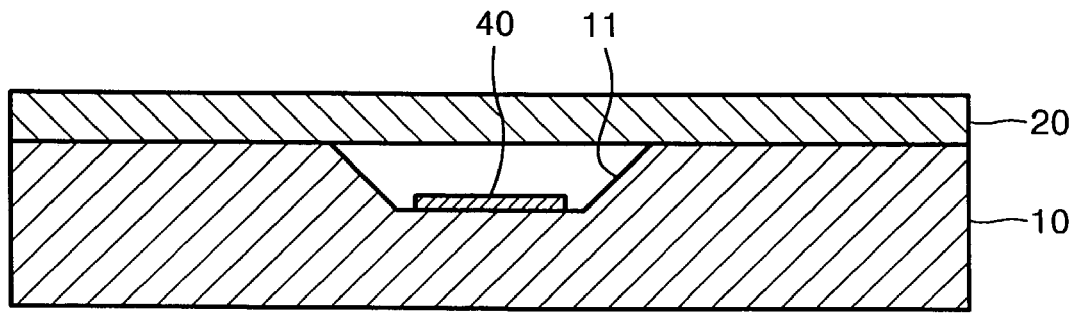

Referring to FIG. 7C, an organic film membrane 20 is formed on the upper surface of the substrate 10 by a lamination method including a thermal pressing process.

Figure 7D:
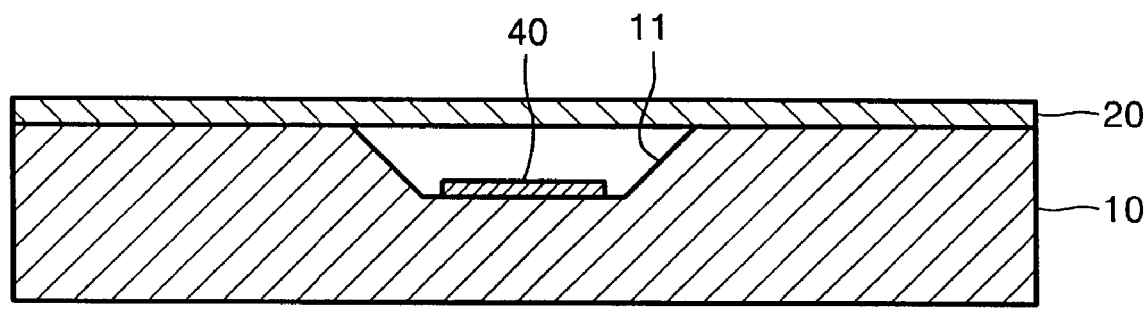

Referring to FIG. 7D, a thermal process is performed on the membrane 20 to reduce the thickness of the membrane 20. When the thermal process is performed on the membrane 20, the membrane 20 is cured and thus the thickness of the membrane 20 is lowered. In some cases, in order to cure the membrane 20 and reduce the thickness of the membrane 20 using the thermal process, ultraviolet rays are radiated to the membrane 20 and the surface of the cured membrane 20 is etched to a predetermined depth using oxygen plasma, after the process of FIG. 7C.

Figure 7E:
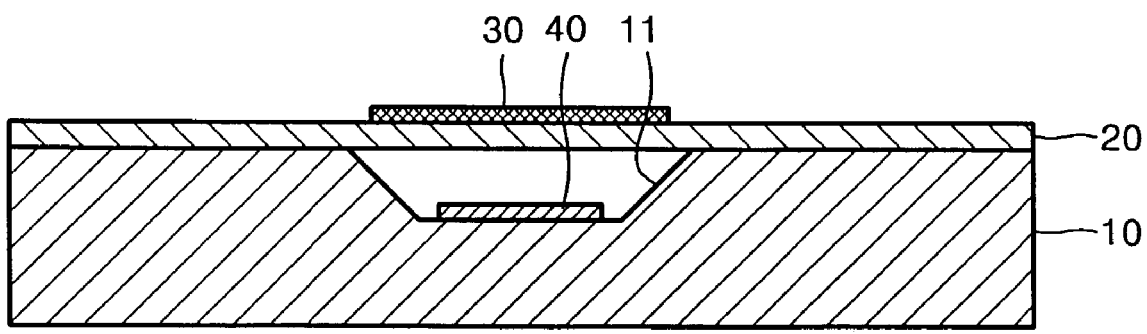

Referring to FIG. 7E, a driving electrode 30 is formed on the membrane 20. Here, the driving electrode 30 is formed by a metal deposition patterning process.

Figure 8:
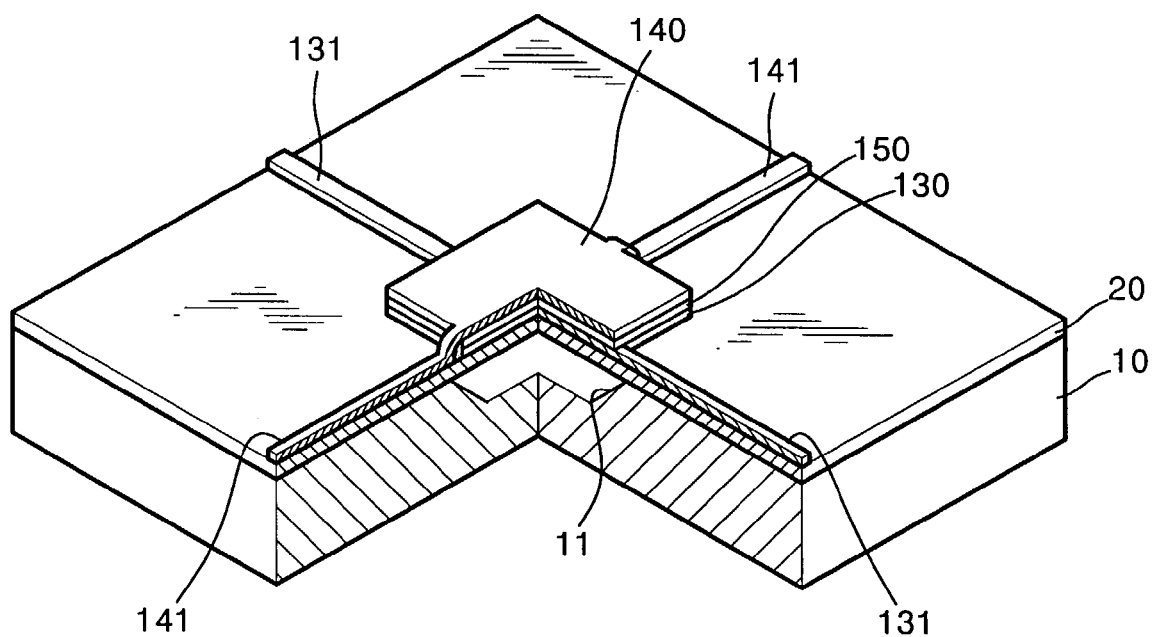
FIGS. 8 through 10 are a perspective view, a plane view, and a sectional view illustrating a piezoelectric actuator according to another exemplary embodiment of the present invention.
Figure 9:
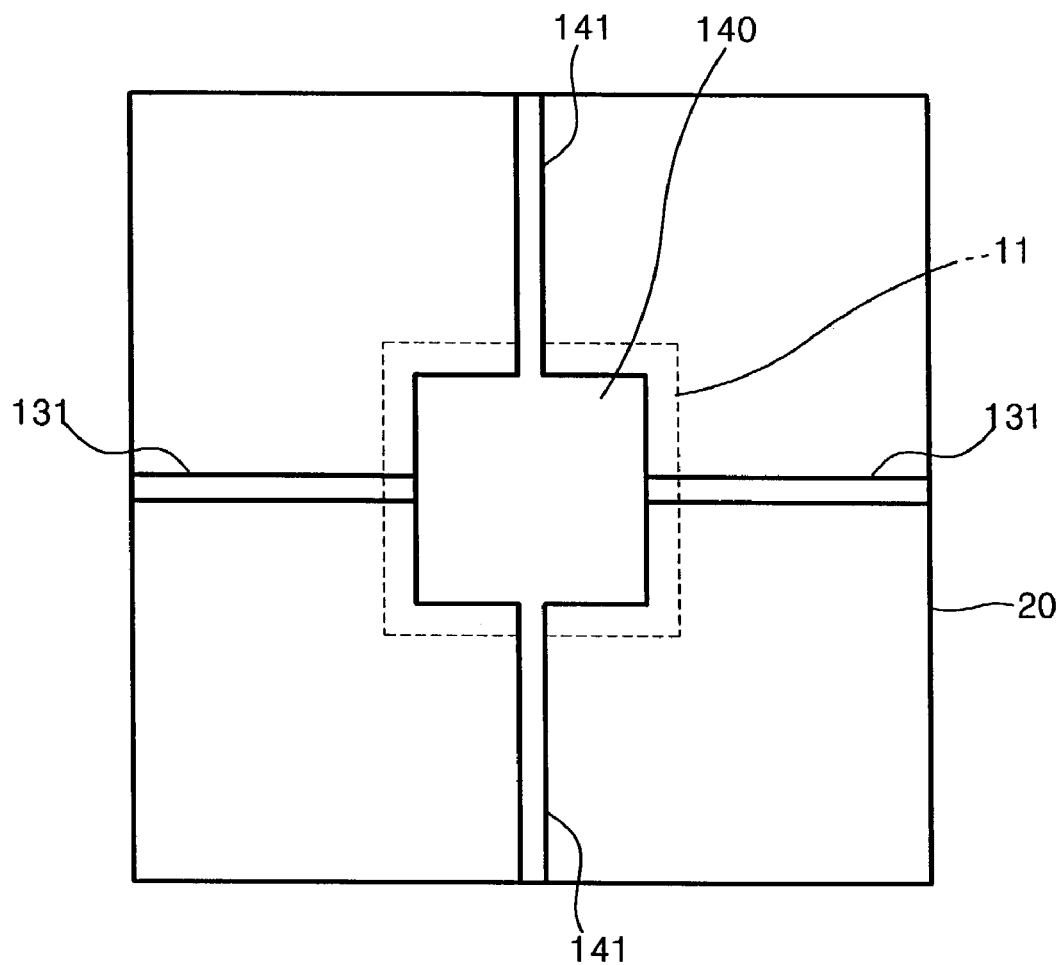
Figure 10:
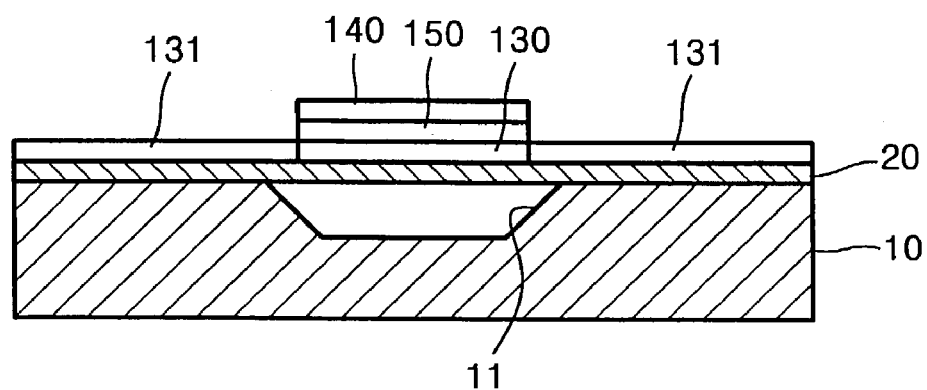

FIG. 8 is a perspective view, FIG. 9 is a plane view, and FIG. 10 is a sectional view illustrating a piezoelectric actuator according to another exemplary embodiment of the present invention, respectively.

Referring to FIGS. 8 through 10, an organic film membrane 20 is attached on the upper surface of a substrate 10. In addition, a piezoelectric driver including an Al lower electrode 130, a piezoelectric material layer 150, and an Al upper electrode 140 is formed on the upper center of the organic film membrane 20. Conductors 141 and 131 are symmetrically formed at both sides of the upper and lower electrodes 140 and 130 so that the conductors 141 and 131 form a cross. The conductors 141 and 131 serve as springs when the membrane 20 changes its shape. Accordingly, preferably, but not necessarily, the conductors 141 and 131 are symmetrically formed as shown in FIG. 9 to normally change the shape of the membrane 20 and restore the membrane 20 to its initial shape. The actuator including a piezoelectric driver can be manufactured according to the conventional method or the manufacturing method of the electrostatic driving actuator according to an embodiment of the present invention.

According to the present invention, a backside wet etching process performed on the substrate to form a membrane is not required, but the cavity is formed by etching the upper surface of the substrate to a depth for driving the membrane, so the process is simplified. In addition, the etched volume is reduced compared with the etched volume in the conventional actuator, so a process time is reduced and the mechanical strength of the wafer is secured to conveniently perform subsequent processes.

Since the etched depth of the silicon substrate is small, the size of the membrane is reduced, so the number of actuator chips for each of the wafers is increased.

The actuator according to the present invention does not require complicated processes, such as wafer bonding for generating an electrostatic force or an electromagnetic force.

Since the organic film membrane is used in the actuator according to the present invention, the mechanical strength of the actuator is improved and consequently, a large transformation amount of the membrane can be obtained using a small driving force. In addition, since the organic film membrane of the actuator according to the present invention has a large dielectric ratio, it is easy to increase an electrostatic force. Furthermore, the actuator according to the present invention can be manufactured using simple processes to reduce a manufacturing cost. Also, by changing the thickness of the membrane or the shape of the conductors, the transformation amount of the membrane can be easily controlled.

While this invention has been particularly shown and described with reference to illustrative, non-limiting embodiments thereof, it will be understood by those skilled in the art that various changes in form and details may be made therein without departing from the spirit and scope of the invention as defined by the appended claims.

What is claimed is:

1. An actuator using an organic film membrane, the actuator comprising:
    a substrate having a cavity with a bottom portion at a predetermined depth in an upper center;
    the organic film membrane attached on an upper surface of the substrate to close an upper portion of the cavity;
    a fixed electrode formed on the bottom portion of the cavity;
    a driving electrode arranged on the organic film membrane while coupling with the fixed electrode; and
    conductors formed from sides of the driving electrode;
    wherein the conductors urge the membrane back to an original shape when the membrane is deformed from said original shape.

2. The actuator of claim 1, wherein said conductors are symmetrically formed at both sides of the driving electrode.

3. An actuator using an organic film membrane, the actuator comprising:
    a substrate having a cavity with a bottom portion at a predetermined depth in an upper center, the bottom portion at least partially closing the cavity;
    the organic film membrane attached on an upper surface of the substrate to close an upper portion of the cavity;
    a piezoelectric material layer arranged on the membrane; and
    upper and lower electrodes arranged on and under the piezoelectric material layer on the membrane, respectively.

4. An actuator using an organic film membrane, the actuator comprising:
    a substrate having a cavity with a bottom portion at a predetermined depth in an upper center;
    the organic film membrane attached on an upper surface of the substrate to close an upper portion of the cavity;
    a piezoelectric material layer arranged on the membrane; and
    upper and lower electrodes arranged on and under the piezoelectric material layer on the membrane, respectively;
    wherein conductors are symmetrically formed at both sides of the lower electrode and the upper electrode, and the lower electrode and the upper electrode extend while crossing each other.

5. The actuator of claim 3, wherein conductors are formed on both sides of the driving electrode and the conductors urge the membrane back to an original shape when the membrane is deformed from said original shape.

* * * * *